United States Patent [19]

Yasuda et al.

[11] Patent Number: 4,980,196
[45] Date of Patent: Dec. 25, 1990

[54] METHOD OF COATING STEEL SUBSTRATE USING LOW TEMPERATURE PLASMA PROCESSES AND PRIMING

[75] Inventors: Hirotsugu Yasuda; Tyau-Jeen Lin, both of Columbia, Mo.; Duck J. Yang, Wilmington, Del.; Joseph A. Antonelli, Riverton, N.J.

[73] Assignee: E. I. du Pont de Nemours and Company, Wilmington, Del.

[21] Appl. No.: 480,356

[22] Filed: Feb. 14, 1990

[51] Int. Cl.$^5$ .............................................. B05D 3/06
[52] U.S. Cl. ........................................ 427/38; 427/47; 427/295; 427/302; 427/327; 427/333; 427/387
[58] Field of Search .................... 427/38, 47, 333, 295, 427/302, 327, 387

[56] References Cited

U.S. PATENT DOCUMENTS

| | | | |
|---|---|---|---|
| 3,582,604 | 6/1971 | Bykhovsky | 219/121 |
| 3,723,289 | 3/1973 | Boom | 204/312 |
| 3,823,489 | 7/1974 | Boom | 34/242 |
| 3,824,398 | 7/1974 | Boom | 250/325 |
| 3,837,894 | 9/1974 | Tucker, Jr. | 117/70 A |
| 4,095,003 | 6/1978 | Weatherly et al. | 427/34 |
| 4,292,397 | 9/1981 | Takeuchi et al. | 430/303 |
| 4,428,847 | 1/1984 | Boxall et al. | 502/101 |
| 4,568,562 | 2/1986 | Phillips | 427/40 |
| 4,737,377 | 4/1988 | Hudgins et al. | 427/39 |
| 4,778,721 | 10/1988 | Sliemers et al. | 427/38 X |
| 4,814,199 | 3/1989 | Boccalon et al. | 427/38 |

FOREIGN PATENT DOCUMENTS 51-83030 of 1976 Japan .

OTHER PUBLICATIONS

"Combined Deposition Process/Processes Create New Composites" *Research and Development,* Oct. 1989.
"Surface Coating of Metals in a Glow Discharge" *Journal of the Oil and Colour Chemists Association,* vol. 48, 1965.
"Plasma Polymerization at Combined Energy Input for Protective Coating of Metal" *Journal of Applied Polymer Science: Applied Polymer Symposium* 42, 233 (1988).
"Plasma Polymerization by Magnetron Glow Discharge. I. Effect of Magnetic Field on Breakdown of Monomers in Low Pressure", J. Vac. Sci. Technol. A. 7 (2) Mar./Apr. 1989.
"Plasma Polymerization by Magnetron Glow Discharge. 111. Effect of Magnetic Field on Sputtering Characteristics of Electrode Materials", J. Vac. Sci. Technol. A 7 (5), Sep./Oct. 1989.
*Recent Development in Surface Coating and Modification Processes,* Principles of Ion Plating, Presented 10/10/85 at Seminar by Tribology Group of Institution of Mechanical Engineers, Published by Mechanical Engineering Publications Limited.

*Primary Examiner*—Bernard Pianalto
*Attorney, Agent, or Firm*—John M. Lynn

[57] ABSTRACT

This invention relates to the use of low temperature plasma technology for significantly improved corrosion protection of steel. The plasma process involves pretreating of the steel surfaces by oxygen plasma and thin film deposition by polymerization of certain precursors on the steel. The process utilizes DC power, substrates as the cathode, magentron anodes, and system pressures of 0.01–0.5 torr. After the thin film plasma deposition it is also preferably to put a primer coating over the thin film.

15 Claims, 2 Drawing Sheets

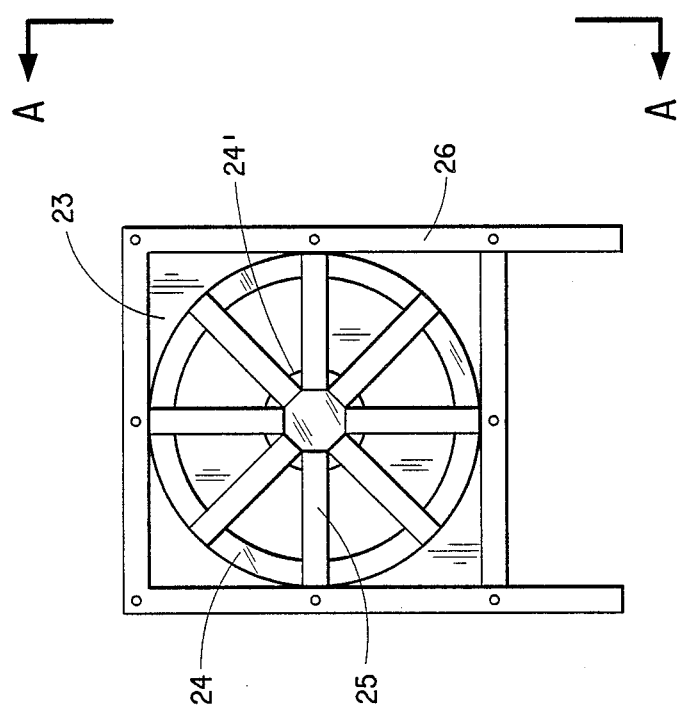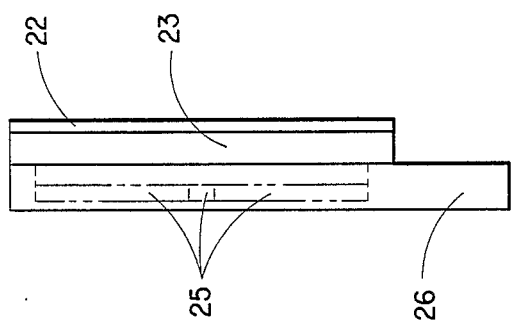

METHOD OF COATING STEEL SUBSTRATE USING LOW TEMPERATURE PLASMA PROCESSES AND PRIMING

Field of the Invention

This invention relates to the use of low temperature plasma technology for the corrosion protection of steel. Our novel process involves reactive or inert gas plasma treatment of the steel, followed by plasma thin film deposition of an organosilane on the treated substrate (which is conducted at ambient temperatures and does not require baking), and finally application of an appropriate primer. Our deposition step process is conducted at ambient temperatures, utilizes DC power with the steel substrate as the cathode, and the anodes are equipped with magnetic enhancement (magnetron).

Background

The corrosion protection of steel substrates is an important industrial process. This process is important for many industries including the automotive industry, steel industry and so forth. Currently the most common methods of corrosion protection of steel substrates are galvanizing, zinc phosphate, electrodeposition of organics, conventional spray or dip priming, oil coating and so forth. However, in the automotive industry and other high performance uses these methods have the following problems: (1) pollution in the form of Volatile Organic Content (VOC), (2) excessive waste disposal, (3) inadequate coverage of recessed areas, and (5) inadequate long corrosion protection performance.

It is known that plasma deposition of thin films gives a very dense layer of film, with uniform deposition, no "pin holes", and good edge coverage. Furthermore this process does not use solvents so there is no VOC problem. Most of the work in the plasma deposition area has been restricted to small objects (e.g. microelectronic components). Plasma processing for larger objects has been used primarily for plastic substrates.

It has been disclosed that it is possible to deposit thin polymer films on metal substrates. The plasma deposition of organic films on metal is generally described in an article entitled "Surface Coating of Metals in a Glow Discharge" in the *Journal of the Oil and Cglour Chemists Association*, Vol. 48, 1965 (hereinafter, the "Glow Discharge" article). This article describes in general terms a method of coating a steel substrate with thin polymer films derived from organic vapors (styrene, acrylates, butadiene, diethyl silicate, and tetraethyl orthosilicate) using glow discharge (i.e. plasma deposition) for short term protection of the steel substrate. The process utilizes AC power, system pressures of 1-5 torr and does not disclose pretreating the steel by reactive (e.g. oxygen) or inert gas (e.g.argon) plasma or a mixture thereof The "Glow Discharge" process would not be a viable method for long term corrosion protection of steel such as is necessary in the automotive industry.

Professor Yasuda disclosed some basics of plasma energy level, the deposition of organosilanes, and oxygen cleaning of the steel substrate in an article entitled *Plasma Polymerization at Combined Enerqy Input For Protective Coating of Metal*, published in the "Journal of Applied Polymer Science: Applied Polymer Symposium 42, 233 (1988). However, this article does not disclose our method of applying the organosilanes or the use of a primer over the organosilane film.

Professor Yasuda disclosed the use of magnetrons in plasma polymerization in the article *Plasma Polymerization by Magnetron Glow Discharge. I. Effect of Magnetic Filed on Breakdown of Monomers in Low Pressure*, published in J. Vac. Sci. Technol. A 7 (2), Mar/Apr 1989. However, this article discusses only AC power not DC power. When magnetrons were used in DC power systems it was previously believed that magnetrons could function only as a cathode and not as an anode (See, *Thin Film Processes*, edited by Vossen and Kern, 1978, page 76, first paragraph).

The use of polysiloxanes as the deposited film in glow discharge for corrosion protection of steel is also disclosed in Japanese Patent No Sho 51 [1976]-83030 issued to Aoki (hereinafter the Aoki patent). This disclosure also teaches the use of AC power and does not teach or suggest pretreating the steel by reactive or inert gas plasma. It is not believed that the Aoki patent technology would have practical utility as a long term corrosion protection method for automotive steel because of adhesion problems.

What is needed is a method of depositing a thin film layer on a variety of different steel substrates to give improved corrosion resistance. The method must result in a film having good adhesion, good edge coverage, good barrier properties and the method must have minimal VOC problems and minimal waste disposal.

SUMMARY OF THE INVENTION

It has been discovered that improved corrosion resistance of steel can be realized if the following is done: (1) pretreating the steel substrate by reactive or inert gas plasma; (2) using DC power from 100-2000 volts preferably 300 to 1200 volts for the plasma deposition; (3) making the steel substrate the cathode; (4) having anode(s) equipped with magnetic enhancement (i.e. magnetron) ; and (5) using organosilane vapors (with or without reactive or inert gas) as the plasma gas to be deposited. This results in excellent coverage (good edge coverage and no pin holes), minimal deposition on the anode or chamber wall (this is: a problem with AC), and a higher plasma film deposition rate than can be realized with AC power. The corrosion protection is especially pronounced when the plasma film layer is subsequently covered with a primer coating.

It has also been found that it may be beneficial to either perform another plasma deposition on top of the first layer deposited or postprocessing of the surface of the plasma layer before it is covered by the primer coating. This postprocessing step can be done to enhance the adhesion between the plasma film and the primer coating. This post processing of the plasma layer preferably results in polarization of the surface of the plasma film layer by forming hydroxyl, acid or base groups which may then react with the primer coating. The post processing step typically involves reactive plasma gas such as oxygen, water, ammonia, etc. or inert plasma gas such as helium, argon, etc.

BRIEF DESCRIPTION OF THE DRAWINGS

FIG. 2 is a frontal view of one of the anodes equipped with a magnetron.

FIG. 2A is a side view of the same anode in FIG. 2.

DETAILED DESCRIPTION OF THE INVENTION

Figure 1:
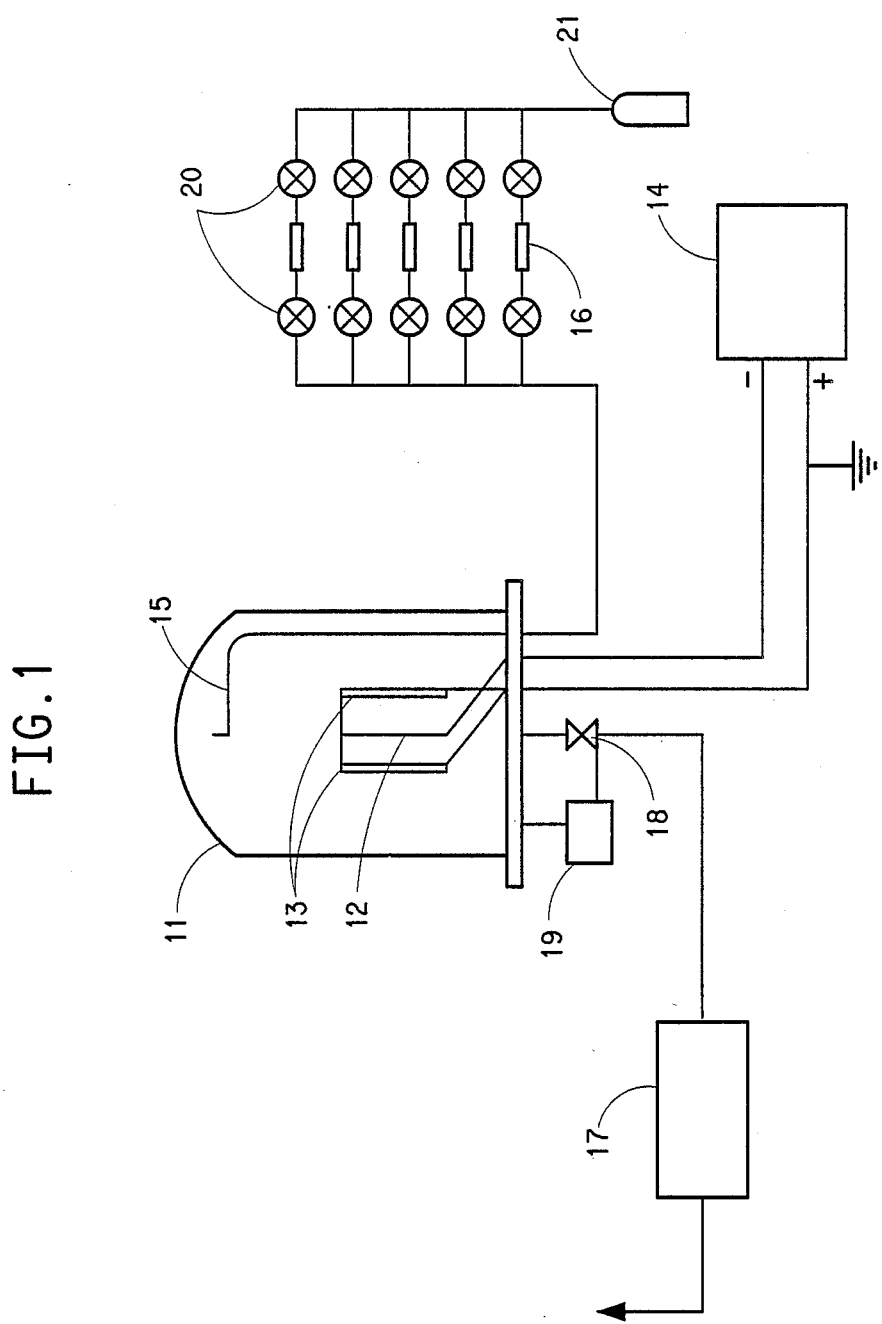
FIG. 1 is a schematic of our plasma deposition system showing the vacuum chamber, electrodes, power source, related piping and so forth.

It has been found that a simple coating system which involves plasma treatment works as an effective way, of protecting a steel surface from corrosion. Our novel system is usable with a variety of different types of steel (e.g. bare steel, cold rolled steel, stainless steel, galvanized steel, phosphated steel and so forth) in a variety of different sizes and shapes. For example the shapes could be preassembled autobody, autobody parts, rolls, coils, sheets and so forth.

Our novel system consists of four basic steps. The first step is pretreatment of the steel substrate with inert or reactive plasma gas. The second step is plasma deposition of a thin film. The third (optional step) is plasma post treatment of the surface of the thin film And the fourth step is the coating of a primer over the post-treated plasma film.

The first step involving the plasma pretreatment with inert or reactive gas is preferable to conventional cleaning and results in better adhesion. (If the steel substrate is oiled, it should be cleaned by conventional methods such as solvent cleaning prior to this plasma processing).

After the plasma pretreatment with inert or reactive gas the second step is coating the steel substrate with a thin layer or layers of plasma formed organic polymer in a highly evacuated chamber. After the plasma deposition, an optional third step is post treatment of the surface of the thin film to enhance the adhesion between the plasma film and the primer coating to be applied over it. This post processing of the plasma layer preferably results in functional groups such as hydroxyl, acid or base which may then react (or be compatible) with the primer coating. The post processing step typically involves reactive plasma gas such as oxygen, water, ammonia, etc. or inert plasma gas such as helium, argon, etc.

The fourth step, application of the primer, can be done in a variety of ways. The important thing is to pick a primer which has good adhesion to the plasma deposited film, good barrier properties and good corrosion protection.

Step 1: Plasma Pretreatment

The overall diagram of our preferred system is shown in FIG. 1. (Note: This figure is only illustrative and one skilled in the art could design a number of effective systems with which to practice our invention. For example it would also be possible for the plasma pretreatment and the plasma deposition to take place in seperate chambers in a continuous process). FIG. 1 shows vacuum chamber 11, cathode 12 (which is the steel substrate), anodes 13, power supply 14, plasma gas feeding line 15, plasma gas flow controllers 16 and vacuum pump 17. The negative pole of DC power supply 14 is connected to the steel substrate to form cathode 12. The grounded positive pole of DC power supply 14 is connected to anodes 13. As shown in FIG. 2, anodes 13 are equipped with a superimposed magnetic field (magnetron). (The magnetron is imperative for the plasma deposition step but is not necessary for the plasma pretreatment step or the plasma post-treatment step). When the magnetron is used in the plasma deposition step the magnetic field at the magnet surface should be between 10–10,000 Gauss, preferably 100–1000 Gauss and most preferably 700 to 900 Gauss. Magnetrons are well known in the art and are generally disclosed in the *Thin Film Processes* book (cited above) at Part II-2 and Part II-4. As will be apparent to one skilled in the art there are numerous ways to superimpose the magnetic field.

FIG. 2 is a detail of the anode arrangement that we used in our examples (The exact dimensions are detailed in the Example Section). Anode 13 is composed of aluminum plate 23; titanium plate 22 (which is attached on inner side of aluminum plate 23); iron ring 24 and circular iron plate 24' (which are attached on the backside of aluminum plate 23); and 8 permanent magnetic bars 25 (which are attaced on circular iron plate 24 and iron ring 24' with the south poles facing the center point). The magnetic field strength ranges from 700–900 gauses. The whole electrode (anode) 13 is then supported by ceramic materials 26. As will be apparent to one skilled in the art, the anode configuration can be varied as well as the materials of construction of the anode. For instance, titanium plate 23 or aluminum plate 22 could be made of other paramagnetic materials with low sputtering yields, and circular iron plate 24' or iron ring 24 could be made of other ferromagnetic materials.

To prepare for the plasma pretreatment and plasma deposition steps the steel substrate is hung at the center between two parallel anodes 13 and the steel substrate is connected to the negative pole of DC power supply 14 so that the steel substrate becomes cathode 12. (In a commercial system it would also be possible to mount the anode(s) on robotic arms in order to cover complicated shapes. The number, size, and shape of anodes and their positioning would change according to the desired use) Vacuum pump 17 is then used to evacuate vacuum chamber 11 until the system pressure is lower than 1 millitorr. The system pressure is controlled, independent of the gas flow rate, by throttle valve 18, using the reading of pressure gauge 19. The pretreatment gas or gases (e.g. oxygen gas or oxygen gas plus argon) is fed into vacuum chamber 11, at the desired flow rate, keeping the pressure below 1 torr, preferably less than 100 millitorr. Our preferred pretreatment gas is oxygen because it removes organic contaminants and may form metal oxides on the surface of the steel substrate. Other reactive gases or inert gases or their mixtures can be used. These other pretreatment gases include air, hydrogen, nitrogen, argon, water vapor and so forth.

The operation parameter of low temperature plasma processes can be given by the energy input level per mass of plasma gas, W/FM, given by joule/kg, where W is electric power input (W = joule/second) into the system, and F is the molar flow rate and M is the molecular weight of gas. (FM represents the mass of low rate.) According to this relationship, the flow rate to be employed is dependent on the power input and molecular weight of gas. This energy input per mass should be between 1 MegaJoule per Kilogram and 2 GigaJoules per Kilogram.

The pretreatment plasma gas is fed through plasma gas feeding line 15 and the rate is controlled by using the appropriate plasma gas flow controller 16. Then power supply 14 is turned on to initiate the plasma state. The power is then adjusted to the desired power level. This power level varies dependent on flow rate, size of substrate, distance from cathode to anode, molecular weight of the pretreatment gas, pressure and so forth. The pretreatment plasma should be maintained for a desired period of time (typically from 30 seconds to 10 minutes) and then power supply 14 should be turned off and the pretreatment gas flow should be stopped using the appropriate plasma gas shut off valve 20. The treatment time depends on the operating parameter W/FM Efficient treatment can be obtained by maintaining the "(energy input) multiplied by (treatment time) divided by (mass)" at between 0.5 GigaJoule-Second per Kilogram and 50 GigaJoule-Sec per Kilogram. After the pretreatment plasma step the vacuum chamber 11 should once again be evacuated using vacuum pump 17 to a pressure of below 1 millitorr. This concludes the plasma pretreatment step. Note: It would also be possible to use AC power or radio frequency (RF) power rather than DC power for the plasma pretreatment step.

Step 2: Plasma Polymer Deposition

The basic concepts of plasma deposition are described in Professor Yasuda's book entitled *plasma Polymerization*, published by Academic Press in 1985. This is accomplished by feeding plasma deposition gas into vacuum chamber 11 through plasma gas flow controller 16 at a desired flow rate. As in the case with the pretreatment plasma, the flow rate is dependent upon the power into the system and the molecular weight of plasma gas. This energy input per mass should be between 1 MegaJoule per Kilogram and 1 GigaJoule per Kilogram depending upon the plasma deposition gas and power level used. While feeding the plasma deposition gas into vacuum chamber 11 it is important to keep the system pressure at between 1 millitorr to 1 torr, preferably 10 millitorr to 500 millitorr and most preferably 20 millitorr to 100 millitorr. As discussed above the system pressure is controlled, independent of the gas flow rate, by throttle valve 18 which uses the reading from pressure gauge 19.

Once the desired flow rate and system pressure is obtained the power is turned on and then adjusted to the desired power level. This power level varies dependent on flow rate, size of substrate, distance from cathode to anode, molecular weight of the plasma gas, pressure and so forth. The plasma deposition should continue for a desired period of time in order to obtain the desired film properties and thickness. The film thickness can range between 10 Angstroms to 10 micrometers, preferably 10 Angstroms to 5,000 Angstroms and most preferably 10 Angstroms-3000 Angstroms. The deposition time is typically from 1 second to 20 minutes, preferably 30 seconds to 10 minutes and most preferably 30 seconds to 2 minutes. Control of the deposition process may also be based upon the "(energy input) multiplied by (deposition time) divided by (mass)". This parameter should be kept between 0.5 GigaJoule-Second per Kilogram and 50 GigaJoule-Sec per Kilogram. After the desired period of time, power supply 14 is turned off and the plasma gas flow should be stopped using the appropriate plasma gas shut off valve 20. The deposition time depends on the power input level divided by mass expressed in Joule per Kilogram. Deposition that is efficient for corrosion resistance is dependent on film adhesion, film barrier properties and film thickness.

Our preferred plasma deposition gas is trimethylsilane (TMS). Alternatives include but are not limited to dimethylsilane (DMS), tetramethylsilane, trimethylethoxysilane, methyltrimethoxysilane, hexamethyldisiloxane or other organosilanes which contain either silicon, oxygen, carbon, phosphorous, or hydrogen or their mixtures, and with or without vinyl unsaturation. Other hydrocarbons containing carbon, hydrogen, oxygen, flouride or their mixtures (e.g methane) could be used. In addition, organometal coupounds containing antimony, phophorous, zinc, titanium, aluminum, tin, zirconium and other metals or their mixtures could be used.

It may also be advantageous to use a carrier gas for the plasma deposition gas (especially if the vapor of high boiling compound is used). The carrier gas can be inert gases such as argon and helium or reactive gases such as oxygen or nitrogen (or mixtures thereof).

Liquid or even solid compounds can also be used as the plasma deposition compound if enough vapor pressure can be created for the compounds to feed into the vacuum system. Gas materials at room termperature are preferred for the purpose of maintaining constant flow rate.

After conclusion of the deposition step, vacuum chamber 11 should be evacuated using vacuum pump 17 to a pressure of below 1 millitorr. This concludes the deposition step. It should be pointed out, however, that further layers of plasma film may be deposited on top of the first layer. These subsequently deposited layers would probably be organics or organometallics other than silanes. While it is imperative that the first layer be deposited as set out above (i.e. D.C. power, with a magnetron on the anode(s)), the subsequently deposited plasma layers could be deposited using alternate power methods known in the art (e.g. A.C. power, microwave, and Radio Frequency (RF) power).

Step 3: Surface Treatment of the Deposited Film

The third step in our process is the optional post treatment step of the surface of the deposited plasma film. This step could be important because post treatment of the surface of the deposited plasma film layer before it is covered by the primer coating may enhance the adhesion between the plasma film layer and the primer coating. However, in certain cases, for economic reasons (i.e. shorter processing time for higher productivity), it may be desirable to skip the post treatment step of the surface of the plasma film and proceed directly to the primer coating step. This post treatment of the plasma film layer preferably makes the surface polar by generating hydroxy groups, acid groups, or base groups (e.g. amines, alkyl amines, amide and so forth). The post treatment step typically involves another plasma treatment with nonpolymerizing reactive gases such as oxygen, water, carbon dioxide, or ammonia (or their mixtures) with or without inert gas(es). An example of post treatment of the plasma film is shown in Example V. It may also be possible to generate polar groups on the surface of the plasma film by chemical methods, dry or wet, which will be obvious to one skilled in the art. For example it is possible to treat the surface of the plasma film with chromic acid in order to generate hydroxy or acid groups on the plasma film surface, or with $SO_3$ gas to sulfonate the surface. (See the book *Polymer Interface and Adhesion*, published in 1982 by Marcel Dekker, Inc. at page 284, section 9.1.2.).

Step 4: Application of the Primer

After the thin film plasma deposition and post treatment of the surface of the thin plasma film a traditional primer coating cover is applied. The steel substrate with the plasma deposited thin film has superior corrosion protection than the same steel without the thin film, but the corrosion protection is dramatically improved after the application of the primer coating Likewise, a steel substrate with both a thin film plasma deposited layer and primer coating has superior corrosion protection to a steel substrate with only the primer coating.

The primer can be applied in any of a number of different manners well known in the art (e.g. cathodic or anodic electrocoating, dipping, spraying, rolling, powder coatings, vacuum deposition polymerization and so forth). Furthermore any of a number of different primer coatings well known in the art may be used. Examples include but are not restricted to acrylic silane, polyester silane, polyester urethane-silane, melamine/polyester, melamine/polyester urethane, epoxy anhydride, epoxy amine, polyester isocyanate, polyether vinyls and so forth.

A preferred primer coating is one which is reactive with the plasma deposited film. When the plasma deposited film is organosilane or organosilane which has been post treated to form hydroxy groups on the surface, then primers such as acrylic silane, polyester silane or polyester urethane-silane, (i.e. primers which contain silanol and alkoxy silane groups) are preferred. A most preferred primer is a trimethoxysilane containing resin. This type of primer is generally described in Kanegafuchi patent No. U.S. 4,801,658.

The primer formula may or may not contain catalysts (or accelerators), such as dialkyl tin oxide compounds, $H_2O$, acids, or organotitanates or organozirconates.

The primer thickness can vary widely. Primer films of 2.5 microns to 125 microns thick can be coated on steels, but a preferred thickness range is 10.0 microns to 50 microns.

After deposition of the primer subsequent top coats may also be applied. These include primer surfacers, monocoats, basecoat/clearcoat or any other topcoat system known in the art.

EXAMPLES

All of the examples, unless otherwise noted, were run as generally described in the Detail Description Section infra. More specific information concerning the Examples are set out below:

(1) Steel substrate: size (4"×6"×0.032") which has been pre-cleaned with solvent if it was oiled.

(2) Vacuum chamber; Pyrex ® bell-jar of 18" in diameter and 30" in height (3) Power Source:
External DC power supply (available from Advanced Energy Industries, Inc. as model MDX-1K)

(4) Electrode Description:
Cathode is the steel substrate described above positioned between two anodes;

Two anodes as shown in FIG. 2. Each anode is composed of aluminum plate 23 (7"×7"×½"), a titanium plate 21 (7"×7"×1/16") which is attached on inner side of aluminum plate 23, an iron ring 24 (7" in outer diameter, 5.5" in inner diameter, 1/16" thick) and iron plate 24 (2" in diameter, 1/16" thick) which are attached on the backside of aluminum plate 23, and 8 pieces of permanent magnetic bars 25 (3"×¼"×¼") which are attaced on the iron plate 24 and iron ring 24 with the south poles facing the center point. The magnetic field strength ranges from 700–800 gauses. The whole electrode (anode) 13 is then supported by ceramic materials 26:

The cathode is positioned between the two parallel anodes with the titanium side facing the cathode at a distance of 2".

(5) Vacuum Pumping Mechanism: A mechanical booster pump (available from Shimadzu Corporation as model MB-100F) in series with a mechanical rotary pump (availble from Sargent-Welch Scientific Company as model 1376).

(6) Pressure gauge: A capacitance barometer (available from MKS Instruments as model 220BA).

(7) Throttle valve (available from MKS Instruments as model 253A) and throttle valve controller (also available from MKS Instrument as model 252A).

(8) Flow controllers: Mass flow controllers (available from MKS Instruments as model 1259B).

Description of Corrosion Resistance Test (Scab Test)

The test panels are scribed The scribe line is at the center of the panel and is about 3 inches long. These scribed panels are then subjected to the following test cycle:

Monday through Friday: 15 minute immersion in 5% NaCl solution 75 minute drying in air at room temperature.

22 hour and 30 minute exposure at 85% R.H. and 60° C. environment.

Saturday and Sunday:

Samples remain in humidity cabinet (85% R.H., 60° C.) Samples were examined occasionally. After completion of the Scab corrosion test, the test panels were removed from the chamber and rinsed with warm water. The samples were examined visually for failure such as corrosion, lifting, peeling, adhesion loss, or blistering. To evaluate the scribe line corrosion creepback (loss of adhesion between primer and steel), the distance between the scribe line and the unaffected primer is measured The average of multiple measurements is calculated.

EXAMPLE I

Bare Steel Substrate/$O_2$ Plasma Pretreatment/TMS Plasma Deposition/Silane Primer.

Substrate: cleaned cold-rolled steel coupon. (Available from ACT Corp. Product designation GMC 92A.)

$O_2$ plasma pretreatment conditions: DC power was 12 watts and 600–800 volts; energy input per mass was 0.25 gigaJoules per kilogram; oxygen gas flow rate was 2 standard cubic centimeter per minute (sccm); system pressure was 30 milliTorr; and power duration was 2 minutes.

Deposition of plasma poly(trimethylsilane) using trimethylsilane gas: DC power was 2 watts and 600–750 volts; energy input per mass was 24 megaJoules per Kilogram; TMS gas flow rate was 1.5 standard cubic centimeter per minute (sccm), system pressure was 50 milliTorr and power duration was 2 minutes.

Application of primer coating: The substrate was removed from the vacuum chamber and the primer was applied. The primer which was applied was our most preferred primer containing methoxysilane functional group. This resin is described in Kanegafuchi Patent No. U.S. 4,801,658. The primer was applied to a thickness of 17.5 microns to 27.5 microns by dipping the steel substrate into the primer It was then cured at 200 F for 30 minutes.

The sample was then subjected to the corrosion test described above for five weeks. The adhesion was good based on a tape test (ASTM D3359). The average creep distance was 1.5 millimeters and there was no blistering. Minor edge corrosion was caused by nonuniform coverage of the primer on the edges not due to the plasma deposition layer. This problem could be eliminated by a different primer application method (e.g. vacuum deposition polymerization or electrocoating).

EXAMPLE II

Zinc-phosphated Chromic Acid Rinsed Steel Substrate/$O_2$ Plasma Pretreatment/TMS Plasma Deposition/Silane Primer Substrate: Zinc-phosphated Chromio Acid Rinsed Steel (available from ACT Corp. product designation GMC-92C; C168 C20 DIW)

$O_2$ plasma pretreatment oonditions: DC power was 12 watts and 600–800 volts: energy input per mass was 0.25 gigaJoules per kilogram; oxygen gas flow rate was 2 standard cubic centimeter per minute (sccm); system pressure was 30 milliTorr; and power duration was 2 minutes.

Deposition of plasma poly(trimethylsilane) using trimethylsilane gas: DC power was 2 watts and 600–750 volts; energy input per mass was 24 megaJoules per Kilogram; TMS gas flow rate was 1.5 standard cubic centimeter per minute (sccm), system pressure was 50 milliTorr and power duration was 2 minutes.

Application of primer coating: The substrate was removed from the vacuum chamber and the primer was applied. The primer which was applied was our most preferred primer containing methoxysilane functional group. This resin is described in Kanegafuchi Patent No. U.S. 4,801,658. The primer was applied to a thickness of 17.5 microns to 27.5 microns by dipping the steel substrate into the primer It was then cured at 200 F. for 30 minutes The sample was then subjected to the corrosion test described above for five weeks. The adhesion was good based on a tape test (ASTM D3359). The average creep distance was 0.9 millimeters and there was no blistering. Very minor edge corrosion was observed and is thought to be caused by nonuniform coverage of the primer on the edges not due to the plasma deposition layer. This problem could be eliminated by a different primer application method (e.g. vacuum deposition polymerization or electrocoating).

EXAMPLE III

Zinc-phosphated Chromic Acid Rinsed Galvinized Steel Substrate/$O_2$ Plasma Pretreatment/TMS Plasma Deposition/Silane Primer Substrate: Zinc-phosphated Chromic Acid Rinsed Galvinized Steel (available from ACT Corporation as product desiqnation GMC 90E Electro G1V70/70; C168 C20 DIW)

$O_2$ plasma pretreatment conditions: DC power was 12 watts and 600–800 volts; energy input per mass was 0.25 gigaJoules per kilogram; oxygen gas flow rate was 2 standard cubic centimeter per minute (sccm); system pressure was 30 milliTorr; and power duration was 2 minutes.

Deposition of plasma poly(trimethylsilane) using trimethylsilane gas: DC power was 2 watts and 600–750 volts; energy input per mass was 24 megaJoules per Kilogram; TMS gas flow rate was 1.5 standard cubic centimeter per minute (sccm), system pressure was 50 milliTorr and power duration was 2 minutes.

Application of primer coating: The substrate was removed from the vacuum chamber and the primer was applied. The primer which was applied was our most preferred primer containing methoxysilane functional group. This resin is described in Kanegafuchi Patent No. U.S. 4,801,658. The primer was applied to a thickness of 17.5 microns to 27.5 microns by dipping the steel substrate into the primer. It was then cured at 200 F. for 30 minutes.

The sample was then subjected to the corrosion test described above for five weeks. The adhesion was good based on a tape test (ASTM D3359). The average creep distance was 1.2 millimeters and there was no blistering. Very minor edge corrosion was observed and is thought to be caused by nonuniform coverage of the primer on the edges not due to the plasma deposition layer. This problem could be eliminated by a different primer application method (e.g. vacuum deposition polymerization or electrocoating).

EXAMPLE IV

Galvinized Steel Substrate/$O_2$ Plasma Pretreatment/TMS Plasma Deposition/ Vacuum Deposition Organic Film Primer Substrate Galvinized Steel (available from ACT Corporation as product designation GMC 90E Elec Zinc G70/70; Clean)

$O_2$ plasma pretreatment conditions: DC power was 12 watts and 600–800 volts; energy input per mass was 0.25 gigaJoules per kilogram; oxygen gas flow rate was 2 standard cubic centimeter per minute (sccm); system pressure was 30 milliTorr; and power duration was 2 minutes.

Deposition of plasma poly(trimethylsilane) using trimethylsilane gas DC power was 12 watts and 800–950 volts; energy input per mass was 144 megaJoules per Kilogram; TMS gas flow rate was 1.5 standard cubic centimeter per minute (sccm), system pressure was 50 milliTorr and power duration was 2 minutes.

Application of primer coating: A coating of organic film primer was carried out with parylene ®C compound (available from Nova Tran Corp. a subsidiary of Union Carbide Corp.) using the vacuum deposition polymerization method described in Professor Yasuda's publication entitled *Polymerization of Para-Xylylene Derivatives (Parylene Polymerization). I. Deposition Kinetics for Parylene N and Parylene C*, in the Journal of Polymer Science: Polymer Chemistry Edition, Vol. 22, 1984, at pages 475 to 491. The primer was applied to a thickness of 10.0 microns at room temperature.

The sample was then subjected to the corrosion test described above for five weeks. The adhesion was good based on a tape test (ASTM D3359). The average creep distance was 1.4 millimeters and there was no blistering. The edge corrosion protection was very good.

EXAMPLE V

Bare Steel Substrate/$O_2$ Plasma Pretreatment/Methane Plasma Deposition/ $CO_2$ plasma post treatment/ Electrodeposited Primer Substrate: Bare Steel (available from ACT Corp. product designation GMC 92A; clean cold rolled steel).

This example is included to show that post treatment of the plasma film layer is a viable option and can result in improved corrosion resistance.

$O_2$ plasma pretreatment conditions: DC power was 12 watts and 600–800 volts; energy input per mass was 0.25 gigaJoules per kilogram; oxygen gas flow rate was 2 standard cubic centimeter per minute (sccm); system pressure was 50 milliTorr; and power duration was 2 minutes.

Deposition of plasma methane polymer using methane gas DC power was 5 watts and 500–600 volts; energy input per mass was 0.21 gigaJoules per kilogram; methane gas flow rate was 2 standard cubic centimeter per minute (sccm); system pressure was 50 milliTorr; and power duration was 2 minutes.

The methane plasma layer was post treated with carbon dioxide plasma gas. The conditions were as follows DC power was 5 watts and 500-600 volts; energy input per mass was 0.076 gigaJoules per kilogram; carbon dioxide gas flow rate was 2 standard cubic centimeter per minute (sccm); system pressure was 50 milliTorr; and power duration was 2 minutes.

The post treated substrate was then subjected to electrodeposition of cathodic epoxy amine resin. The cathodic electrodepositable coating was prepared by using 4 parts (volume) of PPG's E5625 ®resin, 1 part (volume) of PPG's E5605 ®pigment paste, and 4 parts (volume) of deionized water. The cathodic electrodeposition was carried out under conditions well known to one skilled in the art. The electrodeposition took place at 200 volts for a time period of two minutes. The electrodeposited film was then baked at 350 F. for 30 minutes. The film thickness was about 25 microns.

The sample was then subjected to the corrosion test described above for two weeks. Neither the adhesion or the corrosion protection of the above described system over bare steel is comparable to current commericially available electrocoat primers on zincphosphated steel. For example, the creep for this example was 2.3 millimeters, whereas current commercial electrocoat systems over zincphosphate steel have a creep of only about 0.5 millimeters. However, we found that post treating the methane plasma film layer with carbon dioxide plasma gas gives better performance than the same system without carbon dioxide post treatment (2.3 millimeter creep vs. 4.8 millimeter creep without post treatment). The adhesion was good based on a tape test (ASTM D3359).

We claim:

1. A method of coating a steel substrate to protect the steel substrate from corrosion, which comprises:
   (a) first treating the steel substrate with reactive or inert gas plasma;
   (b) next depositing a thin film of organosilane on the steel substrate; and
   (c) applying a primer coating over the thin film of organosilane, wherein said primer coating is reactive with the thin film of organo silane.

2. The method of claim 1, wherein the deposition of organosilane in step (b) is accomplished in a vacuum chamber using DC power with a cathode and at least one anode and the steel substrate is made the cathode, at least one of the anodes has magnetic enhancement and the pressure in the vacuum chamber is less than 1.0 torr.

3. The method of claim 2 where the pressure in the vacuum chamber is between 20 millitorr and 100 millitorr.

4. The method of claim 2 where the organo silcane film is derived from an organosilane which contains either oxygen, carbon, phosphorous, hydrogen or their mixtures.

5. The method of claim 2 where the organosilane film is derived from an organosilane selected from the group consisting of trimethylsilane, dimethylsilane, tetramethylsilane, hexamethyldisiloxane, trimethylethoxysilane and methyltrimethoxysilane.

6. The method of claim 2 where the steel substrate is treated with a reactive gas plasma in step (a).

7. The method of claim 6 where the reactive gas plasma is oxygen.

8. The method of claim 1 where the primer coating is selected from the group consisting of acrylic silane, polyester silane, polyester urethane-silane, melamine/polyester, melamine/polyester urethane, epoxy/anhydride, epoxy/amine, and polyester urethane.

9. The method of claim 8 where the primer coating contains silanol or alkoxy silane functional groups.

10. The method of claim 9 where the primer coating contains trimethoxysilane groups.

11. The method of claim 1 where between steps (b) and (c) the thin film of organosilane is post-treated to polarize the surface of the thin film of organosilan.e in order to enhance adhesion between the organo silane film and the primer coating.

12. The method of claim 11 where the post treatment step involves another plasma treatment step with a nonpolymerizing gas.

13. The method of claim 12 where the nonpolymerizing gas is selected from the group consisting of oxygen, water, carbon dioxide, and ammonia or their mixtures.

14. The method of claim 12 where the nonpolymerizing gas is mixed with an inert gas.

15. The method of claim 11 where the post-treatment forms hydroxy groups, acid groups or base groups on the surface of the thin film of organosilane.

* * * * *